United States Patent
Lin et al.

(10) Patent No.: US 7,454,885 B2
(45) Date of Patent: Nov. 25, 2008

(54) TRAY TO TUBE MANUAL EXCHANGER

(75) Inventors: Yuan-Chi Lin, Hsin-Chu (TW); Meng-Ta Li, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 267 days.

(21) Appl. No.: 11/512,275

(22) Filed: Aug. 30, 2006

(65) Prior Publication Data
US 2008/0006560 A1    Jan. 10, 2008

(30) Foreign Application Priority Data
Jul. 7, 2006    (TW) ............................... 95124808 A (51) Int. Cl.
*B65B 35/32*    (2006.01)
(52) U.S. Cl. .............................. 53/543; 53/147; 53/154; 53/531; 53/539; 53/235; 53/247; 221/79; 221/82; 221/89; 221/93
(58) Field of Classification Search ................... 53/147, 53/154, 531, 539, 543, 585, 235, 244, 247; 221/69, 79, 82, 89, 90, 93
See application file for complete search history.

(56) References Cited

U.S. PATENT DOCUMENTS

| | | | | |
|---|---|---|---|---|
| 3,071,291 A | * | 1/1963 | Davis | ........................... 221/68 |
| 4,344,727 A | * | 8/1982 | Chaloupka | ............... 414/789.1 |
| 5,052,167 A | * | 10/1991 | Scharch | ........................ 53/444 |
| 6,209,194 B1 | * | 4/2001 | Kang et al. | .................... 29/739 |
| 7,273,157 B2 | * | 9/2007 | Kvalheim | ..................... 221/68 |

FOREIGN PATENT DOCUMENTS

TW           445598      *  7/2001

* cited by examiner

*Primary Examiner*—Christopher Harmon
(74) *Attorney, Agent, or Firm*—Muncy, Geissler, Olds & Lowe, PLLC (57) ABSTRACT

A tray to tube manual exchanger is disclosed herein. The manual exchanger includes a tray-fastening module and a bi-axle-rotating module. The tray-fastening module includes a tray-fastening member, a buffer-rail substrate, and a tube-inserting member. The buffer-rail substrate having a plurality of rails is disposed under the tray-fastening member, and the tube-inserting member is disposed at the outlets of the plurality of rails for respectively receiving tubes. The bi-axle-rotating module is pivotally connected to the tray-fastening module. The tray-fastening module clips a tray carrying a plurality of packaged semiconductor devices at a horizontal position, followed by rotating 180 degrees around a second rotating axle of the bi-axle-rotating module, thereby falling the packaged semiconductor devices of each row of the tray onto each rail. Subsequently, the tray-fastening module is inclined to a specified angle around a first rotating axle of the bi-axle-rotating module to make the packaged semiconductor devices of each rail slide into tubes inserted to the tube-inserting member.

13 Claims, 7 Drawing Sheets

TRAY TO TUBE MANUAL EXCHANGER

BACKGROUND OF THE INVENTION

1. Field of the Invention

The present invention generally relates to a manual exchanger, and more particularly to a tray to tube manual exchanger for quickly transferring packaged semiconductor devices from tray to tube.

2. Description of the Prior Art

Semiconductor wafers after design and manufacture still need tester to make sure if the functions of packaged semiconductor devices are normal. The packaged semiconductor devices after packaged are usually transported by tray. However, during the testing the packaged semiconductor devices are often tested by a tube handler. Therefore, it is necessary to transfer the packaged semiconductor devices from tray to tube to perform testing. Besides, when some semiconductor devices transported by tray are tested by tray handler, but they will be shipped by tubes, it is also necessary to transfer the packaged semiconductor devices from tray to tube. Traditionally, the packaged semiconductor devices are transferred only by hand, and therefore not only the demand of the manpower is huge, and transfer rate is slow, but also it is easy to damage products.

In view of the drawbacks of the traditional method to transfer semiconductor devices, there is a need for providing a new tray to tube manual exchanger, by which the semiconductor devices can effectively be transferred from tray to tube. Moreover, it can be operated easily, and has a cheaper price, and has a tiny volume, and can be removed easily, etc.

SUMMARY OF THE INVENTION

One object of the present invention is to provide a tray to tube manual exchanger, by which a tray carrying a plurality of packaged semiconductor devices is rotated to make the packaged semiconductor devices fall onto the buffer-rail substrate, and then the tray-fastening module is inclined to make the packaged semiconductor devices slide into the tubes, and therefore the packaged semiconductor devices are transferred from tray to tube.

Another object of the present invention is to provide a tray to tube manual exchanger, by which a tray at a horizontal position can be rotated 180 degrees to make the packaged semiconductor devices on the tray fall onto the buffer-rail substrate, and then the operator can check if the packaged semiconductor devices are oblique by opening the tray-fastening member.

Further another object of the present invention is to provide a tray to tube manual exchanger, by which the incline angle of the tray-fastening module is adjustable by the size of the packaged semiconductor devices to make packaged semiconductor devices in the buffer-rail substrate slide smoothly into tubes.

According to the above-mentioned objects, the present invention provides a tray to tube manual exchanger. The manual exchanger includes a tray-fastening module and a bi-axle-rotating module. The tray-fastening module includes a tray-fastening member, a buffer-rail substrate, and a tube-inserting member. The buffer-rail substrate having a plurality of rails is disposed under the tray-fastening member, and the tube-inserting member is disposed at the outlets of the plurality of rails for respectively receiving tubes. The bi-axle-rotating module is pivotally connected to the tray-fastening module. The tray-fastening module clips a tray carrying a plurality of packaged semiconductor devices at a horizontal position, followed by rotating 180 degrees around a second rotating axle of the bi-axle-rotating module, thereby falling the packaged semiconductor devices of each row of the tray onto each rail. Subsequently, the tray-fastening module is inclined to a specified angle around a first rotating axle of the bi-axle-rotating module to make the packaged semiconductor devices of each rail slide into the tube inserted to the tube-inserting member.

BRIEF DESCRIPTION OF THE DRAWINGS

FIG. 5A and FIG. 5B show operation process of a tray-fastening module rotating around a second rotating axle, in which FIG. 5A and FIG. 5B are front views respectively illustrating a tray to tube manual exchanger at a first horizontal position and at a second horizontal position according to the embodiment of FIG. 1.

FIG. 7A and FIG. 7B show operation process of a rotating base rotating around a first rotating axle, in which FIG. 7A and FIG. 7B are front views respectively illustrating the rotating base at a horizontal position and at an incline according to FIG. 1's embodiment.

DETAILED DESCRIPTION OF THE INVENTION

Some embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Figure 1:
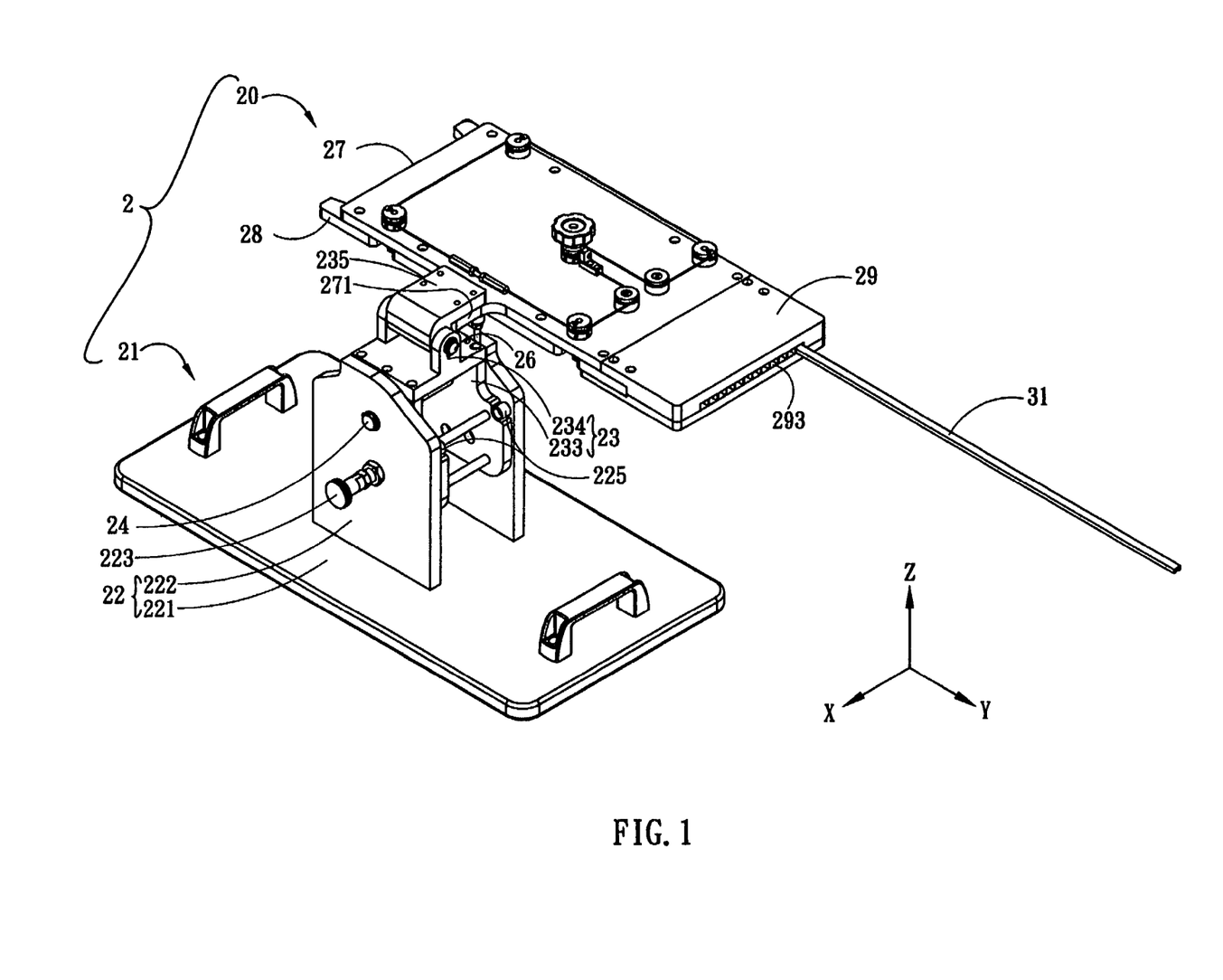
FIG. 1 is a perspective view illustrating a tray to tube manual exchanger according to one embodiment of the present invention.
Figure 2:
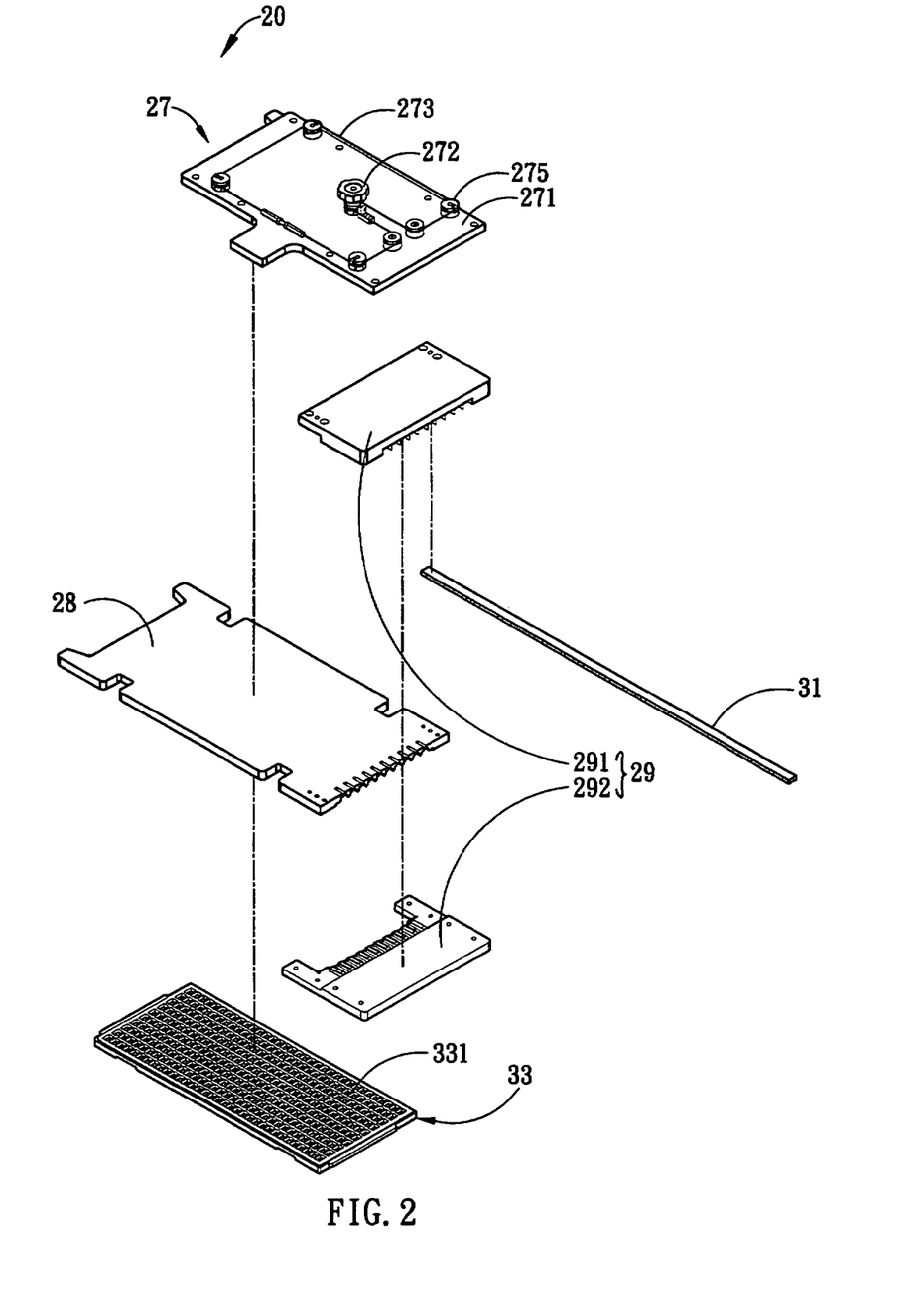
FIG. 2 is an explosive view illustrating a tray-fastening module of FIG. 1.
Figure 3:
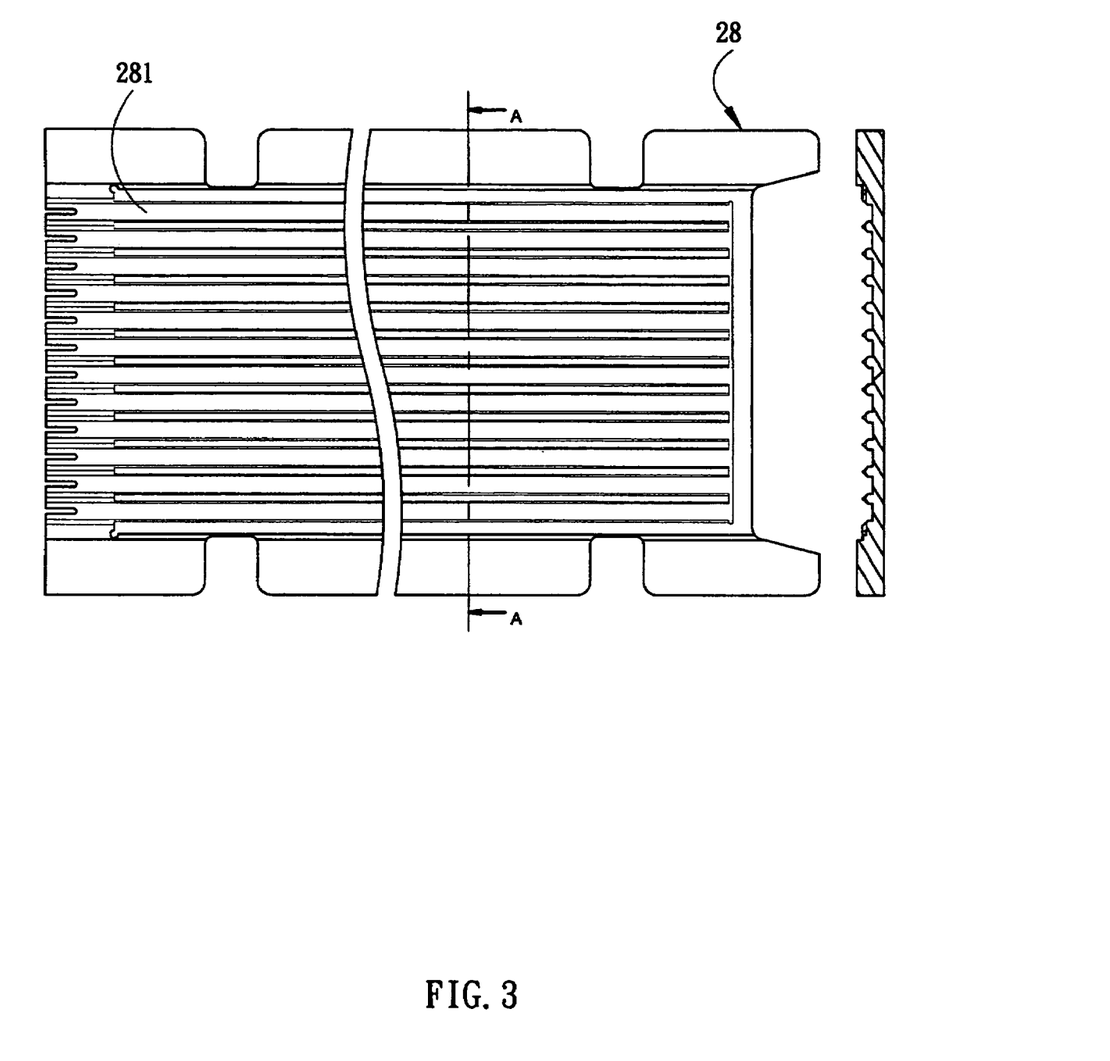
FIG. 3 is a bottom view and a cross-sectional view of a buffer-rail substrate of FIG. 1 and FIG. 2.

FIG. 1 is a perspective view illustrating a tray to tube manual exchanger 2 according to one embodiment of the present invention. The tray to tube manual exchanger 2 includes a tray-fastening module 20 and a bi-axle-rotating module 21. FIG. 2 is an explosive view of components of a tray-fastening module 20. The tray-fastening module 20 is used to clip a tray 33. The tray 33 can be a general tray used in the testing of packaged semiconductor devices (such as packaged integrated circuit), and the tray 33 has a plurality of receive fillisters 331, each of which is used to receive a packaged semiconductor device. The tray-fastening module 20 includes a buffer-rail substrate 28, a tray-fastening member 27, and a tube-inserting member 29. The buffer-rail substrate 28 has a surface (such as bottom surface) on which there is a plurality of rails 281, as shown in the bottom view of FIG. 3 and the cross-sectional view in A-A direction of FIG. 3. These rails 281 are corresponding to each row of receive fillisters 331 of the tray 33. The tray-fastening member 27 disposed at the other surface (such as bottom surface) of the buffer-rail substrate 28 is used to clip the tray 33. The tube-inserting member 29 is serially connected to the buffer-rail substrate 28 inserted by tubes 31.

Figure 4A:
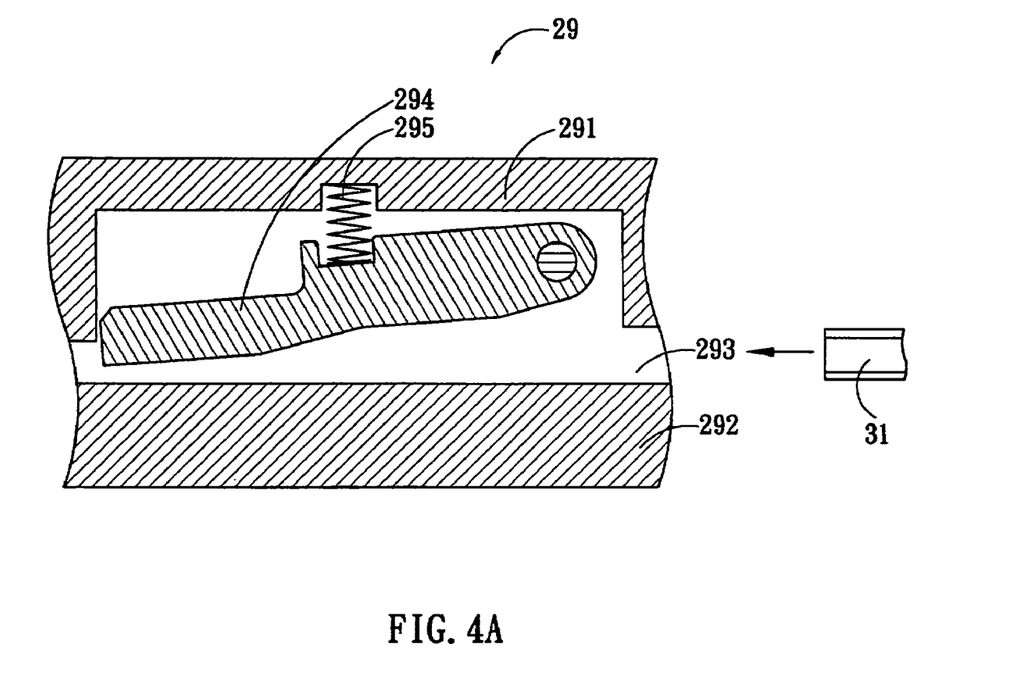
FIG. 4A and FIG. 4B are cross-sectional views illustrating a tube-inserting member according to FIG. 1 and FIG. 2.
Figure 4B:
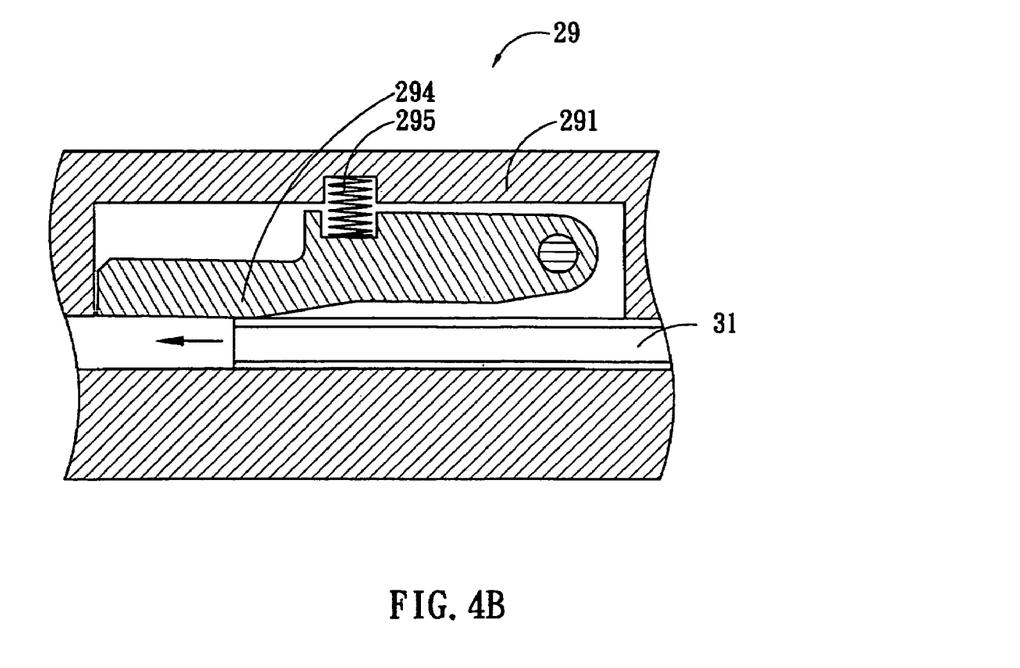

FIG. 4A and FIG. 4B are cross-sectional views illustrating a tube-inserting member 29 according to FIG. 1 and FIG. 2. The tube-inserting member 29 includes a top housing 291 having a plurality of tube-inserting grooves 293 respectively corresponding to each rail 281, each tube-inserting groove 293 inserted by a tube 31; a bottom housing 292 disposed at bottom surface of the top housing 291; a plurality of stop block 294 respectively corresponding to tube-inserting grooves 293, one end of each stop block 294 pivotally connected to the top housing 291; a plurality of elastic component 295, one end of each elastic component 295 connected to the stop block 294 and the other end of the elastic component 295 connected to the top housing 291; whereby each stop block 294 can block the corresponding tube-inserting groove 293. Furthermore, when tubes 31 are inserted into tube-inserting grooves 293, tubes 31 can push away the stop blocks 294 to make the rails 281 of the buffer-rail substrate 28 communicate with the tubes 31. Meanwhile, the stop blocks 294 can push the tubes 31 to prevent the tubes 31 from loosing. Of course, when the tubes 31 are pulled away, the stop blocks 294 pushed by the elastic components 295 can block the tube-inserting grooves 293.

Figure 7A:
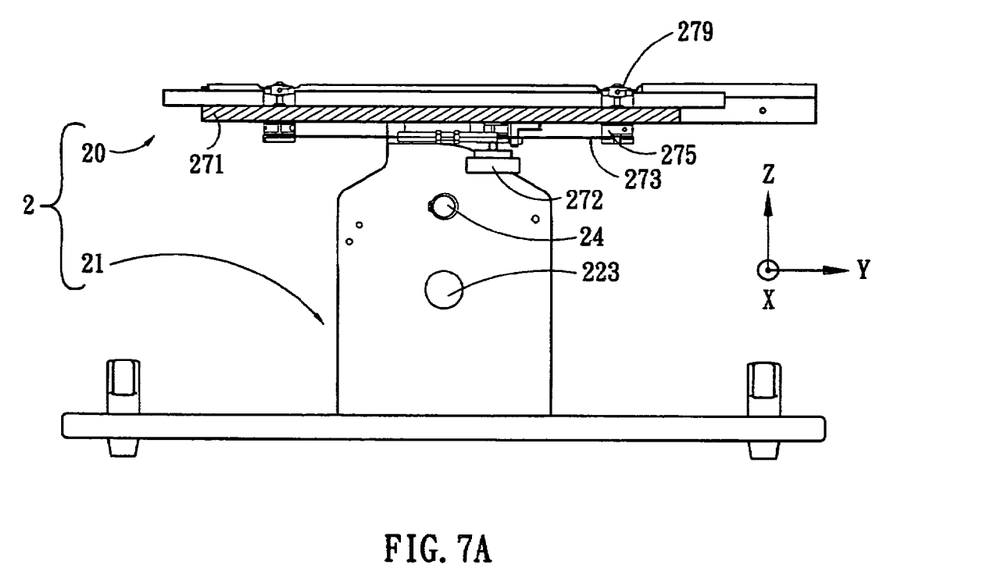

Referring to FIG. 2 again, the above-mentioned tray-fastening member 27 includes a tray-fastening board 271; a hand wheel 272 disposed on the tray-fastening board 271; a plurality of belt wheels 275 respectively pivotally penetrating the tray-fastening board, one end of each belt wheel 275 having a crook 279 (as shown in FIG. 7A) assembled cooperatively with the tray 33; and a belt 273 to serially interconnect the hand wheel 271 and the other end of the belt wheels 275; whereby when the hand wheel 272 is rotated corresponding to the tray-fastening board 272, the belt 273 will drive the plurality of belt wheels 275, and the plurality of belt wheels 275 will be rotated relative to the tray-fastening board 271 to make each crook 279 able to fix or loose the tray 33.

Referring to FIG. 1 again, the bi-axle-rotating module 21 includes a base 22 and a rotating base 23, in which the base 22 includes a baseplate 221 and at least one base wing 222 disposed on the baseplate 221. The rotating base 23 includes at least one first wing 233 and at least one second wing 234. Furthermore, the base 22 further includes a bolt 223 which is able to be penetrably inserted into a base wing 222 and a first wing 233 so that the rotating base 23 can be fixed relative to the base 22, wherein the first wing 233 has a locating hole (not shown in the figure) to allow the bolt 223 to be inserted into, and then the rotating base 23 can be fixed relative to the base 22.

In the embodiment, the tray to tube manual exchanger 2 includes two rotating axes: a first rotating axle 24 by which the rotating base 23 is pivotally connected to the base 22, that is, the base wing 222 is pivotally connected to the first wing 233 by the first rotating axle 24; a second rotating axle 26 by which the tray-fastening module 20 is pivotally connected to the rotating base 23.

In the embodiment of the present invention, the above-mentioned manual exchanger 2 for transferring packaged semiconductor devices from tray 33 to tube 31 mainly follows the following two operation procedures. First, the tray-fastening module 20 is rotated around the second rotating axle 26 to make the packaged semiconductor devices inside the tray 33 fall onto the corresponding rails 281. Then, the rotating base 23 is rotated and inclined around the first rotating axle 24 relative to the base 22 to make the packaged semiconductor devices slide into tubes 31. The following description will cooperate with the drawings to illustrate the two operation procedures.

Figure 5A:
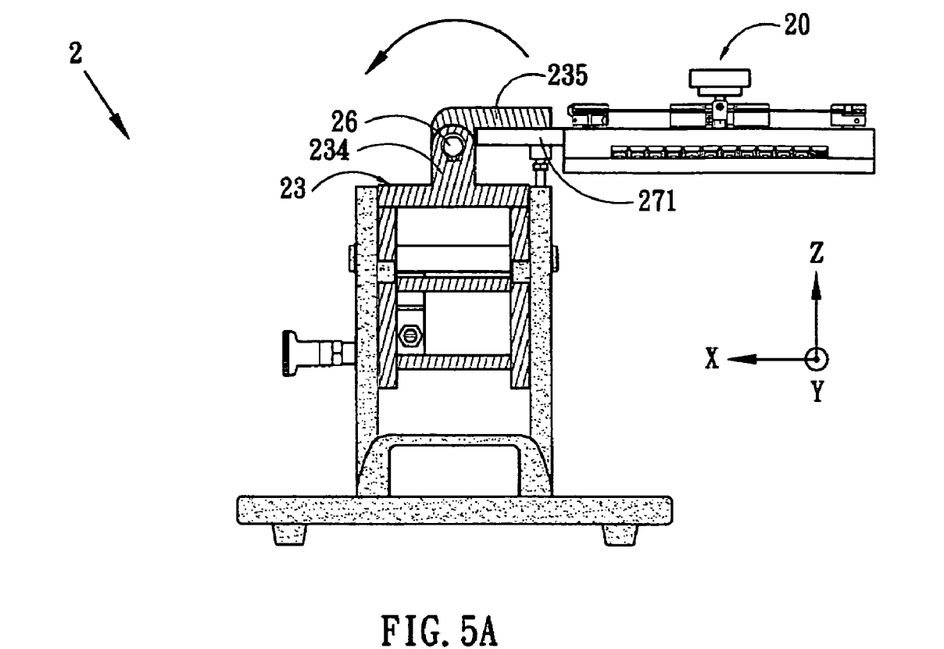
Figure 5B:
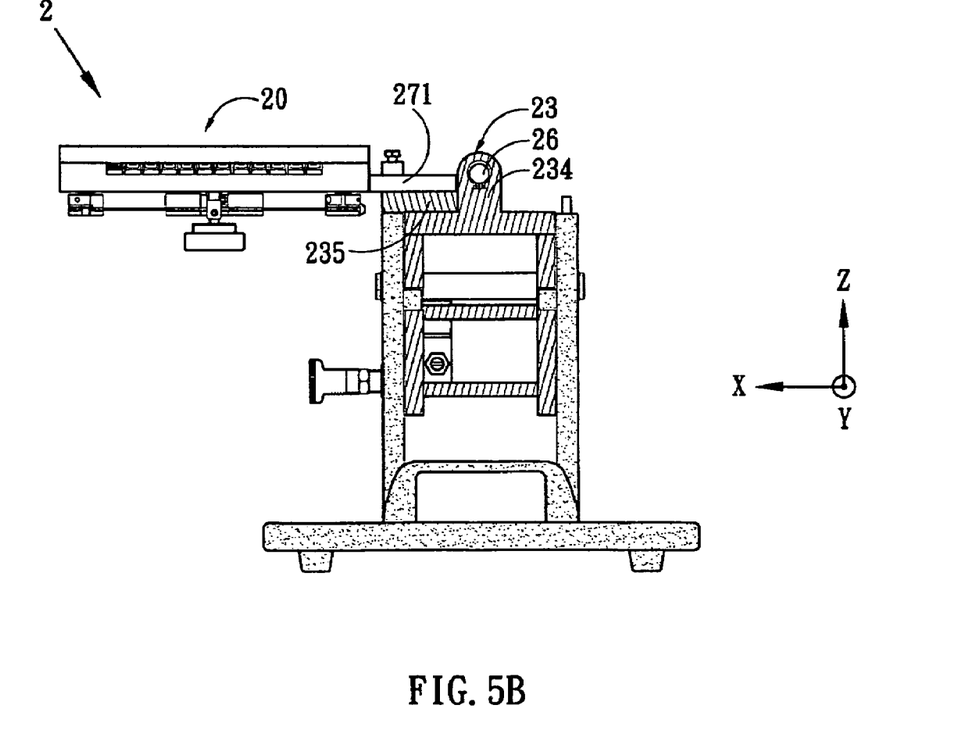

FIG. 5A and FIG. 5B are front views respectively illustrating a tray to tube manual exchanger 2 at a first horizontal position and at a second horizontal position according to the embodiment of FIG. 1. The tray to tube manual exchanger 2 further includes a switch board 235, one end of the switch board 235 firmly connected to the tray-fastening module 20, the other end of the switch board 235 pivotally connected to the rotating base 23 by the second rotating axle 26, wherein the switch board 235 is firmly connected to the tray-fastening board 271. Furthermore, the second rotating axle 26 pivotally interconnects the second wings 234 and the switch board 235. Therefore, the tray-fastening module 20 can be rotated counterclockwise 180 degrees around the second rotating axle 26 from a first horizontal position (FIG. 5A) to a second horizontal position (FIG. 5B). At the same time, the semiconductor devices inside the tray 33 will fall onto the corresponding rails 281.

Figure 6:
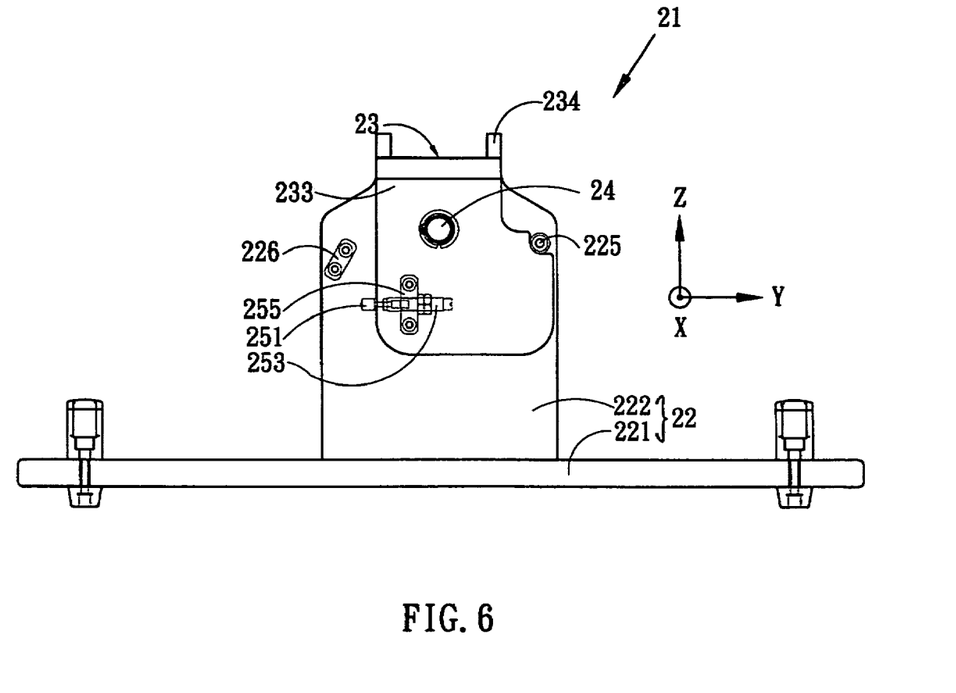
FIG. 6 is a side view illustrating part of a bi-axle-rotating module dismantled a base wing according to FIG. 1.

FIG. 6 is a side view illustrating part of a bi-axle-rotating module 21 dismantled a base wing 222 according to the embodiment of the present invention. Referring to FIG. 6 cooperating with FIG. 7A and FIG. 7B, the following will describe how the rotating base 23 is rotated, inclined relative to the base 22 around the first rotating axle 24 so that each packaged semiconductor device falls slides into tubes 31, wherein FIG. 7A and FIG. 7B respectively illustrate the horizontal position and incline position of the rotating base 23. The base wing 222 having at least one first limit block 225 and at least one second limit block 226 thereon is assembled cooperatively with a first wing 233 to limit the rotating angle of the rotating base 23 relative to the base 22. That is, when the bolt 223 is pulled away, the rotating base 23 is rotated relative to the base 22, and meanwhile the first limit block 225 can stop the first wing 233 of the rotating base 23 to prevent the rotating base 23 from be rotated counterclockwise around the x-axis. In another word, the rotating base 23 only can be rotated clockwise around the first rotating axle 24.

Figure 7B:
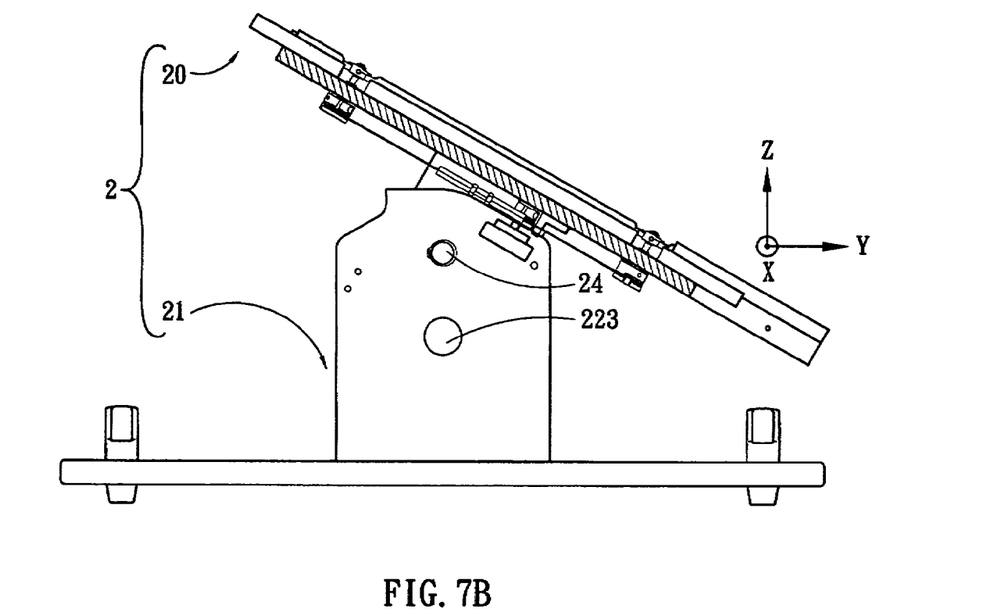

Furthermore, a first wing 233 has a switch tapped hole 255 into which a buffer cylinder 251 is inserted. When the buffer cylinder 251 collides with a second limit block 226, the rotating base 23 can be slowly inclined to a predetermined angle because the buffer cylinder 251 has a buffer effect and can release huge impact force. Moreover, the other end of the buffer cylinder 251 has an adjustable component 253 capable of being rotated to remove the buffer cylinder 251 relative to the switch tapped hole 255 and therefore to adjust the position of the buffer cylinder 251 relative to the first wing 233. Hence, the adjustable component 253 can be rotated to control the buffer cylinder 251 moving forward or backward and therefore to adjust the position of the buffer cylinder 251 relative to the first wing 233 so that the incline angle of the rotating base 23 can be adjusted. Consequently, when the rotating base 23 is rotated clockwise around the first rotating axle 24 from the horizontal position (as shown in FIG. 7A), the buffer cylinder 251 will collides with the second limit block 226 to make the rotating base 23 incline slowly to a predetermined position (as shown in FIG. 7B) so that each row of packaged semiconductor devices inside each rail 281 can slide into each tube 31. Hence, the purpose of quickly transferring packaged semiconductor devices from tray 33 to tube 31 is achieved. Therefore, the incline angle of the buffer-rail substrate 28 can be adjusted according to the size of packaged semiconductor devices so that the packaged semiconductor devices on the buffer-rail substrate 28 can slide smoothly into tubes 31.

According to the abovementioned descriptions of the embodiment of the present invention, the tray to tube manual exchanger 2 has the following advantages:

1. In order to make the packaged semiconductor devices slide smoothly from the buffer-rail substrate 28 into tubes 31, the slide angle of the buffer-rail substrate 28 can be adjusted according to the size and weight of the package semiconductor devices to make the packaged semiconductor devices slide smoothly into tubes 31.
2. In the embodiment, the tray to tube manual exchanger 2 is designed by modules. In order to transfer packaged semiconductor devices with different types and weights, and according to their types and sizes, only the buffer-rail substrate 28 and the tube-inserting member 29 need to be changed. Therefore, the tray to tube manual exchanger 2 has the advantages of being changed quickly and easily.

3. When the tray-fastening module 20 is rotated 180 degrees around the second rotating axle 26 and meanwhile the plurality of packaged semiconductor devices inside the tray 33 fall onto the rails 281, the tray-fastening member 27 can be opened to check the position and orientation of the packaged semiconductor devices inside the buffer-rail substrate 28. Then, the bolt 223 is pulled away to make the rotating base 23 and the tray-fastening module 20 incline, and then the packaged semiconductor devices slide smoothly into tubes 31.

4. In the embodiment, the tray 33 is fastened closely to the buffer-rail substrate 28 so that when the packaged semiconductor devices fall onto the buffer-rail substrate 28, the packaged semiconductor devices can be free from being oblique or rotating 90 degrees.

5. In the embodiment, the tray to tube manual exchanger 2 has the advantages of having a tiny volume and being transported easily. Besides, owing to being designed by modules, the tray to tube manual exchanger 2 also can be decomposed and then transported.

Although specific embodiments have been illustrated and described, it will be appreciated by those skilled in the art that various modifications may be made without departing from the scope of the present invention, which is intended to be limited solely by the appended claims.

What is claimed is:

1. A tray to tube manual exchanger for transferring packaged semiconductor devices from tray to tube, said tray to tube manual exchanger comprising:
   a tray having a plurality of receive fillisters, each of which is used to receive a packaged semiconductor device;
   a tray-fastening module comprising: a buffer-rail substrate having a plurality of rails on one surface to be assembled cooperatively with said plurality of receive fillisters; a tray-fastening member on the other surface of said buffer-rail substrate to firmly clip said tray; and a tube-inserting member serially connected to said buffer-rail substrate, said tube-inserting member having a plurality of tube-inserting grooves respectively corresponding to each rail, each said tube-inserting groove being able to receive a tube; and
   a bi-axle-rotating module comprising: a base and a rotating base; wherein said rotating base is pivotally connected to said base by a first rotating axle and said tray-fastening module is pivotally connected to said rotating base by a second rotating axle;
   whereby said tray-fastening module is rotated relative to said rotating base to make said plurality of packaged semiconductor devices fall onto said corresponding rails, and then said rotating base is rotated relative to said base to make said packaged semiconductor device respectively slide into said tubes.

2. The tray to tube manual exchanger according to claim 1, wherein said tray-fastening member comprises:
   a tray-fastening board;
   a hand wheel disposed on said tray-fastening board;
   a plurality of belt wheels pivotally penetrating said tray-fastening board, one end of each belt wheel having a crook assembled cooperatively with said tray; and
   a belt serially interconnecting said hand wheel and the other side of each belt wheel;
   whereby when said hand wheel is rotated relative to said tray-fastening board, said belt will drive each said belt wheel and each said belt wheel will be rotated relative to said tray-fastening board to make each said crook able to fix or loose said tray.

3. The tray to tube manual exchanger according to claim 1, wherein said tube-inserting member comprises:
   a top housing having a plurality of tube-inserting grooves;
   a bottom housing disposed at a bottom surface of said top housing; and
   a plurality of stop block respectively corresponding to said tube-inserting grooves, one end of each said stop block pivotally connected to said top housing; and
   a plurality of elastic components, one end of each said elastic component connected to each said stop block, the other end of each said elastic component connected to said top housing;
   whereby each said stop block can block said corresponding tube-inserting groove, and when a plurality of tubes are inserted into said tube-inserting grooves, said tubes can push away said stop blocks to make said rails of said buffer-rail substrate communicate with the tubes and said stop blocks push said tubes.

4. The tray to tube manual exchanger according to claim 1, further comprising a switch board, one end of said switch board firmly connected to said tray-fastening module, the other end of said switch board pivotally connected to said rotating base.

5. The tray to tube manual exchanger according to claim 4, further comprising at least one second wing to make said second rotating axle pivotally interconnect said at least one second wing and said switch board.

6. The tray to tube manual exchanger according to claim 4, wherein said switch board can be firmly fixed to said tray-fastening board of said tray-fastening module.

7. The tray to tube manual exchanger according to claim 1, wherein said base comprises a baseplate and at least one base wing disposed on said baseplate.

8. The tray to tube manual exchanger according to claim 7, wherein said rotating base has at least one first wing pivotally connected to said at least one base wing by said first rotating axle.

9. The tray to tube manual exchanger according to claim 8, further comprising a bolt penetrably inserted into said base wing and said first wing to make said rotating base fixed relative to said base.

10. The tray to tube manual exchanger according to claim 8, wherein said base wing has at least one first limit block and at least one second limit block thereon to be assembled cooperatively with said first wing and to limit rotating angle of said rotating base relative to said base.

11. The tray to tube manual exchanger according to claim 10, wherein said base wing has a switch tapped hole into which a buffer cylinder is inserted, and when one end of said buffer cylinder collides with said second limit block, said rotating base can be slowly inclined to a predetermined angle.

12. The tray to tube manual exchanger according to claim 11, wherein the other end of said buffer cylinder has an adjustable component capable of being rotated to move said buffer cylinder relative to said switch tapped hole and therefore to adjust a position of said buffer cylinder relative to said first wing.

13. The tray to tube manual exchanger according to claim 9, wherein said first wing has at least one locating hole to allow said bolt inserted into and then to make said rotating base fixed relative to said base.

* * * * *